(12) United States Patent
Purdy (10) Patent No.: US 9,684,050 B2
(45) Date of Patent: Jun. 20, 2017

(54) METHOD AND APPARATUS FOR THE RECONSTRUCTION OF MR IMAGES

(71) Applicant: Siemens Healthcare GmbH, Erlangen, OT (DE)

(72) Inventor: David Embrey Purdy, Pearland, TX (US)

(73) Assignee: Siemens Healthcare GmbH, Erlangen (DE)

( * ) Notice: Subject to any disclaimer, the term of this patent is extended or adjusted under 35 U.S.C. 154(b) by 561 days.

(21) Appl. No.: 14/262,865

(22) Filed: Apr. 28, 2014

(65) Prior Publication Data
US 2015/0310641 A1    Oct. 29, 2015

(51) Int. Cl.
*G01R 33/565* (2006.01)
*G01R 33/56* (2006.01)

(52) U.S. Cl.
CPC ........ *G01R 33/565* (2013.01); *G01R 33/5608* (2013.01); *G01R 33/56509* (2013.01); *G06T 2207/10088* (2013.01)

(58) Field of Classification Search
CPC .............. G01R 33/565; G01R 33/5608; G01R 33/56509; G06T 2207/10088
See application file for complete search history.

(56) References Cited

U.S. PATENT DOCUMENTS

| 5,644,646 A | * | 7/1997 | Du | G06T 5/008 324/308 |
| 2008/0012566 A1 | * | 1/2008 | Pineda | G01R 33/5611 324/309 |
| 2012/0002858 A1 | * | 1/2012 | Huang | G01R 33/5611 382/131 |

OTHER PUBLICATIONS

Margosian, P., Schmitt, F. and Purdy, D., "Faster MR imaging: imaging with half the data." Health Care Instrum 1.6 (1986): 195-197.
Gibney, et al, "Quantitative Evaluation of Several Partial Fourier Reconstruction Algorithms Used in MRI" Magn. Reson. Med. 30:51-59 (1993).
Noll, et al, "Homodyne detection in magnetic resonance imaging", IEEE Trans Med Imaging. 1991, 10(2), pp. 154-163.

* cited by examiner

*Primary Examiner* — Rodney Bonnette (57) ABSTRACT

A method for producing an image of an object located in the field of view of a Magnetic Resonance (MR) imaging system including determining a center of an echo, shifting the data elements of the raw matrix by whole positions to align the center of the echo, multiplying the shifted raw matrix by a low pass filter, Fourier transforming the filtered matrix, dividing each nonzero pixel of the low resolution complex image by its magnitude, calculating a blending function shifted by the determined fractional echo position, multiplying each data element of each row of the raw matrix by corresponding blending function coefficient values, performing a two-dimensional Fourier transform in row directions and column directions, multiplying the complex image by a complex conjugate of the phase map and extracting the real part of the complex numbers in the phase corrected image to provide the image of the object.

22 Claims, 7 Drawing Sheets

METHOD AND APPARATUS FOR THE RECONSTRUCTION OF MR IMAGES

TECHNOLOGY FIELD

The present application relates generally to methods, systems, and apparatuses for Magnetic Resonance (MR) imaging, and in particular, to methods, systems, and apparatuses for reconstructing images more efficiently by reducing the number of data elements acquired in a matrix using a blending function.

BACKGROUND

In magnetic resonance (MR) imaging, signal values are acquired as a function of time and changes in the magnetic field. The conventional detection hardware outputs two signals, which are digitized synchronously and independently. The two numbers that represent the signal at a given instant are stored as the real and imaginary part of a complex number. These complex numbers are arranged in a two-dimensional or higher-dimensional matrix of complex numbers referred to as raw data or k-space data. This matrix is a "Fourier hologram," which is reconstructed to form a useful image. For ordinary reconstruction, an "inverse" Fourier transformation is performed on each row of data (the "row transform") to form a "half-transformed" matrix. The inverse Fourier transform is then performed on each column of the half-transformed matrix (the "column transform") to form a complex image. The combined effect of these two transformations is referred to as the 2-dimensional (2-D) Fourier transform. For simplification purposes, 2-D reconstructions are described herein, but the principles may be applied to higher dimensions in a non-limiting fashion. In the most general case of Fourier reconstruction, a complex MR image having N rows and M columns, and comprising NM pixel values, each with independent real and imaginary values, or equivalently magnitudes and phases, is the result of Fourier transformations of a matrix comprising NM complex raw data points. Thus, both the raw data matrix and the complex image have 2NM independent parameters.

The radiofrequency (RF) excitation pulses that rotate the nuclear magnets (spins) from their equilibrium magnetization parallel to the main magnetic field (conventionally termed the +z direction) into the x-y transverse plane, leave all or most of the spins pointing in one direction (e.g., they direction). If all of the spins have the same direction, they have the same phase, and all of the complex pixels of the reconstructed image also have the same phase. In this case, the number of independent parameters in the image is halved to NM+1, and it is possible to reconstruct the image from approximately half of the NM complex raw data points without sacrificing image quality, other than increasing the noise in the image (reducing the "signal-to-noise ratio"). This reduction in the number of data points may be used, for example, to shorten the scan time, which increases patient comfort and reduces the artifacts created by patient motion.

SUMMARY

Embodiments provide a method for producing an image of an object located in the field of view of a Magnetic Resonance (MR) imaging system. The image is reconstructed from a subset of data elements less than a raw matrix of data elements having N number of rows of data elements and M number of columns of data elements. The method includes determining a center of an echo expressed as a whole column number, a fractional column number, a whole row number and a fractional row number of the raw matrix and shifting the data elements of the raw matrix by whole positions to align the center of the echo, expressed as the whole column number and the whole row number, with the center of the raw matrix. The method also includes multiplying the shifted raw matrix by a low pass filter to provide a filtered matrix, Fourier transforming the filtered matrix to provide a low resolution complex image and dividing each nonzero pixel of the low resolution complex image by its magnitude to provide a phase map and calculating a blending function that compensates for the image artifacts created by fractional misalignment of the echo center with elements of the raw matrix. The blending function is shifted by the determined fractional echo position, and having blending coefficient values corresponding to each line of raw matrix data elements. The method further includes multiplying each data element of each row of the raw matrix by corresponding blending function coefficient values, performing a two-dimensional Fourier transform in row directions and column directions to provide a complex image and multiplying the complex image by a complex conjugate of the phase map to provide a phase corrected image. The method further includes extracting the real part of the complex numbers in the phase corrected image to provide the image of the object.

According to one embodiment, the subset of data elements is data from a plurality of contiguous rows less than the N number of rows of data elements. In one aspect of the embodiment, the plurality of contiguous rows extend from a top row of the matrix and continue past a central row without extending to a bottom row of the matrix. In another aspect of the embodiment, the plurality of contiguous rows extend from a bottom row of the matrix and continue past a central row without extending to a top row of the matrix.

According to another embodiment, the subset of data elements is data from a plurality of contiguous columns less than the M number of columns of data elements. In one aspect of the embodiment, the plurality of contiguous columns extend from a left end column of the matrix and continue past a central column without extending to a right end column of the matrix. In another aspect of the embodiment, the plurality of contiguous columns extend from a right end column of the matrix and continue past a central column without extending to a left end column of the matrix.

In another embodiment, the subset of data elements is data from three-dimensional slices.

In yet another embodiment, the subset of data elements is data from a dimension using Fourier transformation to provide the image of the object.

In an aspect of an embodiment, the method further includes calculating the absolute values of the pixels of the image of the object to provide an absolute value image.

Embodiments provide a method for producing an image of an object located in the field of view of a Magnetic Resonance (MR) imaging system. The image is reconstructed from a subset of data elements less than a matrix of data elements having N number of rows of data elements and M number of columns of data elements. The method includes determining a center of an echo corresponding to a column of the raw matrix and a row of the raw matrix with a data element having the largest magnitude, shifting the data elements of the raw matrix by whole positions to align the center of the echo with the center of the raw matrix and multiplying the shifted raw matrix by a low pass filter to provide a filtered matrix, Fourier transforming the filtered matrix to provide a low resolution complex image and divided each nonzero pixel of the low resolution complex image by its magnitude to provide a phase map and Fourier transforming the shifted raw matrix to provide a complex image. The method also includes applying a phase correction to the complex image by multiplying each pixel by the complex conjugate of the corresponding pixel of the phase map and Fourier transforming the columns of the image to obtain a half-transformed matrix. The method further includes calculating a blending function having blending function coefficient values for the data elements, said blending function cutting off rows of data damaged by the phase correction, multiplying the rows of data elements of the half-transformed matrix by corresponding blending function coefficient values and inverse Fourier transforming in a column direction and extracting real parts of the complex numbers to provide the image of the object.

According to one embodiment, the subset of data elements is data from a plurality of contiguous rows less than the N number of rows of data elements.

According to another embodiment, the subset of data elements is data from a plurality of contiguous columns less than the M number of columns of data elements.

In another embodiment, the subset of data elements is data from three-dimensional slices.

In yet another embodiment, the subset of data elements is data from a dimension using Fourier transformation to provide the image of the object.

Embodiments provide an article of manufacture for operating a Magnetic Resonance (MR) image reconstructing system, the article of manufacture comprising a non-transitory, tangible computer-readable medium holding computer-executable instructions for performing a method for producing an image of an object located in the field of view of a Magnetic Resonance (MR) imaging system. The image is reconstructed from a subset of data elements less than a matrix of data elements having N number of rows of data elements and M number of columns of data elements. The method includes determining a center of an echo expressed as a whole column number, a fractional column number, a whole row number and a fractional row number of the raw matrix, shifting the data elements of the raw matrix by whole positions to align the center of the echo, expressed as the whole column number and the whole row number, with the center of the raw matrix and multiplying the shifted raw matrix by a low pass filter to provide a filtered matrix. The method also includes Fourier transforming the filtered matrix to provide a low resolution complex image and dividing each nonzero pixel of the low resolution complex image by its magnitude to provide a phase map, calculating a blending function that compensates for the image artifacts created by fractional misalignment of the echo center with elements of the raw matrix, said blending function being shifted by the determined fractional echo position, and having blending coefficient values corresponding to each line of raw matrix data elements and multiplying each data element of each row of the raw matrix by corresponding blending function coefficient values. The method further includes performing a two-dimensional Fourier transform in row directions and column directions to provide a complex image, multiplying the complex image by a complex conjugate of the phase map to provide a phase corrected image and extracting the real part of the complex numbers in the phase corrected image to provide the image of the object.

DETAILED DESCRIPTION

Known methods of reconstructing images from partial raw matrices ("partial Fourier" reconstructions) seek an advantageous compromise between processing speed and image artifacts. Embodiments of the present invention provide non-iterative methods of significantly reducing artifacts at a cost of a 50% increase in processing time. Embodiments of the present invention provide non-iterative methods for modestly improving image quality with insignificant additional processing time. Embodiments of the present invention improve the quality of partial Fourier images by modifying the use of the blending function of the Margosian method for a raw data matrix having acquired data in the upper half, a few adjacent rows of data in the lower half, and unfilled rows in the remainder of the lower half 217 in FIG. 2.

Figure 1:
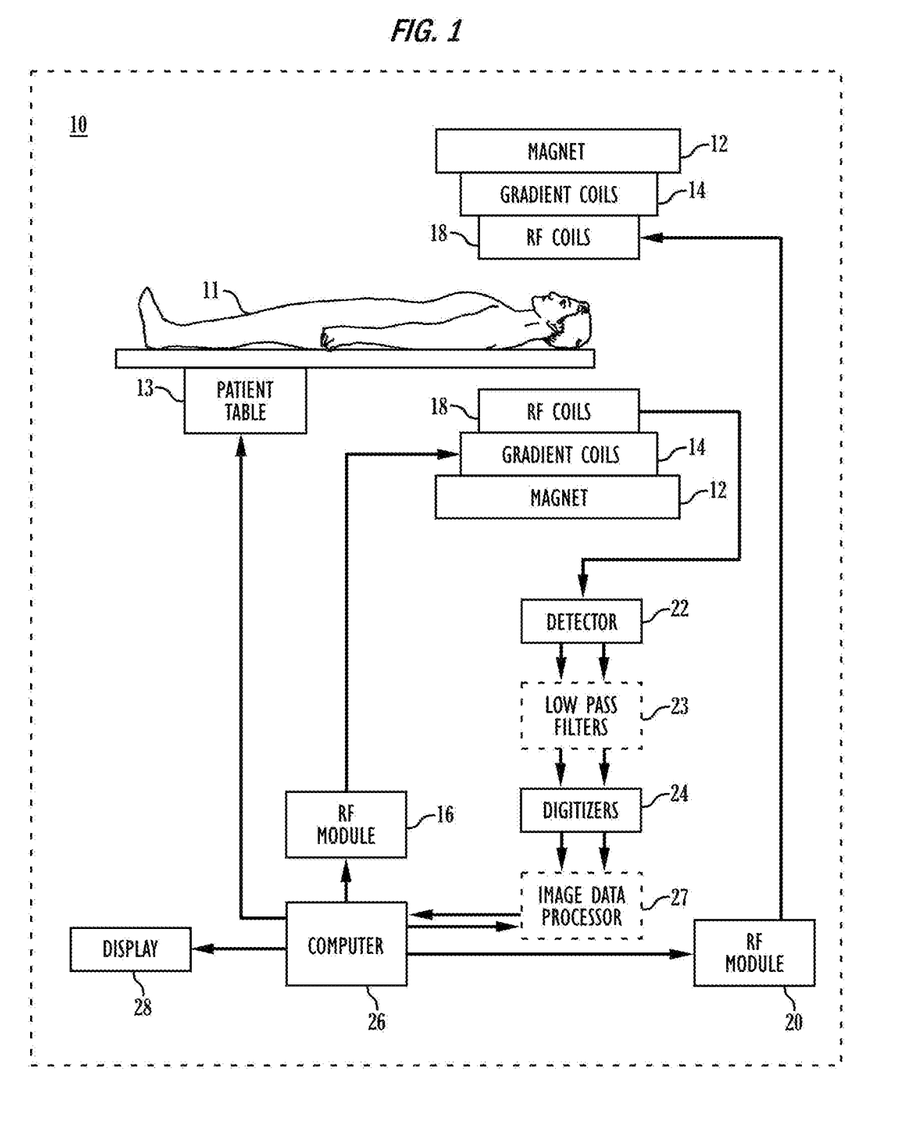
FIG. 1 is a block diagram illustrating a system for acquiring MR imaging data of a portion of patient anatomy, for use with embodiments disclosed herein.

FIG. 1 is a system block diagram illustrating a system 10 for acquiring MR imaging data of a portion of patient anatomy. As shown at FIG. 1, magnet 12 creates a static base magnetic field in the body of patient 11 to be imaged. Within the magnet system are gradient coils 14, which, in response to gradient currents supplied thereto by gradient module 16, produce position dependent magnetic field gradients in three orthogonal directions and generate magnetic field pulse sequences. The magnetic field gradients include a slice-selection gradient magnetic field, a phase encoding gradient magnetic field and a readout gradient magnetic field that are superimposed on the static magnetic field and applied to patient 11 on patient table 13.

Further, within the magnet system are RF coils 18, which, in response to RF signals supplied thereto by RF module 20, produce RF excitation pulses which induce rotation of the spins of the protons in the imaged body 11 by ninety degrees or by one hundred and eighty degrees for so-called "spin echo" imaging, or by a different angle useful for the particular imaging technique. In response to the applied RF pulse signals, the RF coils 18 receive MR signals (e.g., signals from the excited protons within the body as they return to an equilibrium position established by the static and gradient magnetic fields). The MR signals are detected by a detector 22 (comprising a preamplifier, amplifier, and quadrature detector), which has as its output two signals. The two MR signals are then filtered by a pair of analog low-pass filters 23, converted into digital signals by a pair of digitizers 24 and applied to the MR system computer 26. Alternatively, the function of analog low-pass filters 23 may be carried out by subjecting the image representative digital signals supplied from digitizers 24 to digital filtration algorithms in computer 26. In some embodiments, the image data processor (e.g., image data processor 27) may be external to the MR system computer 26. MR system computer 26, in conjugation with additional sub-processors, coordinates the slice-selection, phase encoding, and readout gradient magnetic fields, the radio frequency transmission, the magnetic resonance signal detection, the digitization of signals, and the processing of the digital signals to acquire magnetic resonance data representing planar slices of patient 11 and to provide reconstructed images to display 28.

In conventional MR imaging, M pairs of data points are rapidly acquired while a steady magnetic field gradient is applied to the anatomy during a readout period of the acquisition. The gradient is known as the readout gradient and the spatial direction of the gradient is known as the readout direction. Typically, one row of the complex raw data matrix is filled with these M pairs of data points. The row of data contains spatial information about the anatomy in the readout direction. After the first readout period, a magnetic field gradient having a direction perpendicular to the readout direction is briefly applied to the anatomy. This step is known as phase encoding, the gradient is know as the phase-encoding gradient, and the spatial direction of this gradient is know as the phase-encoding direction. This step encodes spatial information in the phase-encoding direction. After phase-encoding, additional data are acquired in a second readout period. These data are used to fill an adjacent row of the raw matrix, and this process is continued until the desired N rows have been acquired. After reconstruction of the image by row and column Fourier transformations, the directions are unchanged: the direction along the rows (horizontal in FIG. 2) is the readout direction, and the direction along the columns (vertical in FIG. 2) is the phase-encoding direction.

Although the nuclear spins are nearly aligned following the first RF pulse, these spins precess at different rates because of the action of various gradient fields, and they quickly fall out of phase with one another, reducing the MR signal. Typically, it is desirable to acquire and digitize both the buildup and the decay of the MR signal, so the readout gradient is manipulated to dephase and then rephase the spins. The moment of maximum rephasing corresponds to the highest MR signal, and is called the "echo." In this fashion, data are collected on both sides of the echo. Similarly, the phase-encoding gradient is manipulated to acquire data having both less phase encoding and more phase encoding than the encoding required for the maximum MR signal, so conventional MR raw data matrices have the center of the echo in the center of the 2-D matrix. Such full matrices are quickly and robustly reconstructed with the 2-D Fourier transform. To reduce imaging time, however, it would be desirable to reduce the number of acquired points, while making high quality, full resolution reconstructions from a subset of the rows or columns of the raw matrix. Starting with a partial raw matrix, reconstruction with the standard 2-D Fourier transform usually yields images with substantial artifacts, and special partial-Fourier algorithms are required. For simplicity, embodiments of the present invention describe image reconstruction from a block of contiguous rows extending from the top of the matrix, through the central row, and continuing for a few additional rows (shown as region 215 in FIG. 2). The remaining rows (shown as region 217 in FIG. 2) are filled with zeros. A saving of imaging time is accomplished by not acquiring these rows. Embodiments may also include acquiring rows other than the rows in region 215. For example, imaging time may be saved by acquiring a block of contiguous rows extending from the bottom of the raw matrix, through the central row, and continuing upward for a few additional rows. Embodiments may also include acquiring columns of the matrix. For example, imaging time may be saved by acquiring a block of contiguous columns on the left or on the right.

Partial-Fourier reconstruction relies on the reduction of independent variables that occurs when all of the complex image pixels have the same phase. The image processing is best described by assuming that this phase is zero, that is, that the imaginary component of each pixel is zero. It is often difficult to determine the absolute phase in MR imaging, so a constant-phase image will usually have a phase that is not zero. Such images may be made all real by the trivial operation of multiplying each element of the image matrix by the same complex number, a "zero-order" phase correction. This operation is automatically performed by the higher-order phase corrections described herein.

Special properties of the raw data matrix and the image matrix are directly linked because the reconstruction of the image by the inverse Fourier transform is fully reversed by the so-called forward Fourier transform. The raw data and the image data are different representations of the same information. Some phenomena are more easily described in the "raw domain," and others in the "image domain." This convertibility makes it possible to describe the effect that, for example, an all-real image has upon the raw matrix even though the reconstruction proceeds in the other direction.

Ensuring that the complex image is all real imposes a special structure on the raw data matrix. This can be described by considering the effect that each nonzero data point in the raw matrix has on the image. In MR imaging, the rows and columns of the raw matrix are conventionally numbered by the wavenumber k, $k_y$ for the row numbers and $k_x$ for the column numbers (see FIG. 2). The effect of one nonzero raw element at row $k_y$ and column $k_x$ is to create, following the row and column Fourier transformations used for ordinary image reconstruction, a wave in the image with $k_x$ cycles in the x direction and $k_y$ cycles in the y direction (the spatial frequencies). This complex wave has a constant magnitude but a rotating phase, so the waves of brightness can be visualized by examining, for example, the real part of the image. The complete image is the summation of the wave patterns associated with each element of the raw data matrix. The data element at position ($k_x=0$, $k_y=0$) represents the zero spatial frequency in the image (a constant offset in brightness). This element is positioned in the center of the raw matrix, by which is meant row (N/2)+1 and column (M/2)+1, counting from 1 at the upper left in FIG. 2.

Figure 2:
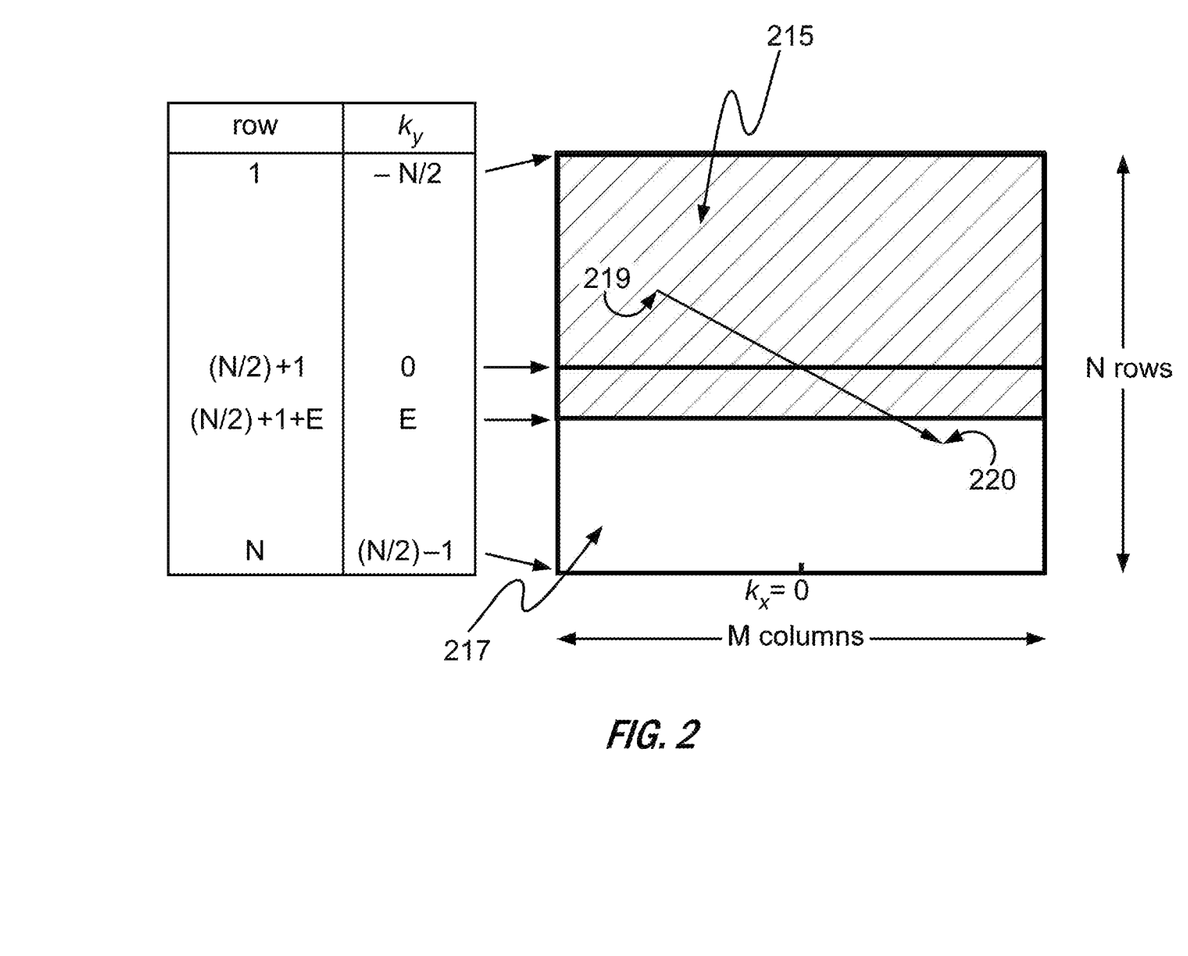
FIG. 2 shows a partially-filled raw data matrix and illustrates two numbering systems for the matrix elements, for use with embodiments disclosed herein.

In FIG. 2, the top row has the index $k_y=-N/2$. This represents the highest ("Nyquist") spatial frequency in they direction of the image. A first raw data element with complex amplitude (a+bi) at position ($k_x=0$, $k_y=-1$) gives rise to a one-cycle wave in the image. The magnitude of this wave is constant, while the phase rotates from negative real to negative imaginary to positive real to positive imaginary across they extent of the image. The imaginary components of this wave can be cancelled by creating a similar one-cycle wave that has the same magnitude, but the opposite helical handedness: the phase rotates from negative real to positive imaginary to positive real to negative imaginary. Only one other element of the raw matrix can create an image wave with the same spatial frequency and orientation, and that is the point at ($k_x=0$, $k_y=+1$).

A second raw data element at this position having a complex amplitude of (a−bi) creates the desired counter-rotating wave. When both raw data elements are present in the raw matrix, their equal contributions to the real image add, while their imaginary image contributions cancel. Considering additional raw data elements, the imaginary part of the image brightness wave created by an element with complex amplitude (a+bi) at position ($k_x=-g$, $k_y=-h$) (219 in FIG. 2) is cancelled by the counter-rotating wave created by a raw data element with complex amplitude (a−bi) at position ($k_x=g$, $k_y=h$) (220 in FIG. 2). Just as the relationship of the complex amplitudes of these two raw data points cancels any imaginary component in the image, so the existence of an all real image forces the raw matrix, connected to the image by the forward Fourier transform, to have this "hermitian" symmetry, which specifies the complex conjugate amplitude relationship of points at ($k_x=-g$, $k_y=-h$) and ($k_x=g$, $k_y=h$), i.e., points that are reflected diagonally through the center of the matrix as shown in FIG. 2. If one knows, from the design of the MR acquisition, that the image resulting from reconstruction of a full raw matrix would be all real, then the raw data matrix would be hermitian, and the amplitudes of elements in the lower matrix ($k_y$ from +1 to N/2−1) can be predicted from the values in the upper matrix ($k_y=-1$ to 1−N/2). In theory, it is possible to speed up the MR acquisition by not acquiring some or all of the lower rows, thus creating a "partial Hermitian matrix."

In one conventional method of image reconstruction, acquired upper raw matrix elements such as ($k_x=-g$, $k_y=-h$) 219 in FIG. 2 are, after changing the sign of the imaginary component (complex conjugation), copied to fill in missing lower matrix elements such as ($k_x=+g$, $k_y=+h$) 220 in FIG. 2. The full matrix is then Fourier transformed to yield the image.

If the full raw data matrix is assumed to be hermitian, the imaginary components of the upper matrix in FIG. 2 will be fully cancelled by the imaginary components of the lower matrix, and it is not necessary to compute this cancellation. Another conventional method of reconstruction Fourier transforms the raw matrix after filling the lower elements (rows $k_y=+1$ to $k_y=N/2-1$) with zeros. The real part of the resulting complex image is extracted to become the final image, while the heavily blurred imaginary part is ignored. Because the $k_y=0$ row does not have a handedness in they direction, it represents a sum of components from both halves of the matrix, and its magnitude must be halved to add its contribution properly to the upper raw data rows used for the reconstruction. Similar considerations apply to the Nyquist row ($k_y=N/2$), but this row makes only a small contribution to the image in most cases, and its treatment is outside the scope of the present invention.

In practice, MR images reconstructed from full matrices often show undesired phase variations across the extent (field of view) of the image, and the images are customarily displayed as the magnitude of the complex image to suppress this variation. The raw matrix is thus not hermitian, and attempts to reconstruct partial-Fourier images from the upper rows of this matrix with the first said method of reconstruction create a discontinuity between the acquired upper rows and the calculated lower rows, leading to artifacts. Attempts to reconstruct these same upper rows with the second said method can cause some of the non-cancelled imaginary components, which are heavily blurred, to appear in the real image. For either reconstruction method, the artifacts are often unacceptable.

In the hermitian matrix, the center of the echo is centered at ($k_x=0$, $k_y=0$), but various technical difficulties may shift the center of the echo away from the sampling point at the center of the raw matrix. By the Fourier Shift Theorem, shifting the echo by one whole raw matrix position creates a one-cycle phase roll (linear phase ramp) in the complex image; smaller phase rolls in the image correspond to fractional row and column shifts in the raw matrix. These "first-order phase errors" are corrected to obtain a high quality real image. A coarse phase correction of the image is obtained by cyclically shifting the acquired raw data by whole positions within the raw matrix to align the highest magnitude data point (the point presumably closest to the center of the echo) with the center of the raw matrix. Finer adjustments to the image phase to correct for fractional element shifts of the raw data or, for example, for anatomy-specific changes in the magnetic field are more conveniently carried out in the image domain with the aid of a low resolution phase map.

In another conventional method (hereinafter the Margosian method) of image reconstruction, E additional rows of data are collected below the $k_y=0$ row. The acquired data are shown as shaded region 215 in FIG. 2. In step 2, the center of the echo is determined by finding the column and row (integers $s_x$ and $s_y$) of the raw data point with the largest magnitude, and this point is moved to the matrix center ($k_x=0$, $k_y=0$) by shifting all of the elements of the raw data matrix cyclically by whole positions. In step 3, a low-resolution phase map is created by ordinary (full-Fourier) image reconstruction of a few central rows of the raw matrix. The acquisition of E additional rows ensures a few rows symmetrically disposed about the $k_y=0$ central row. Because a downward shift of the matrix will expand the number of available central rows, define $F=(E-s_y)$. The central rows are then $k_y=-F$ to $k_y=+F$. A low pass filter symmetric around ($k_x=0$, $k_y=0$) is applied in two dimensions. In they direction, the filter coefficient is zero for all non-central rows. After performing inverse Fourier transforms in the row and column directions, each complex pixel is normalized to form an N×M phase map. There is no need to extract explicit phase values in, for example, radians.

In step 4, a monotonic blending function is created to achieve a smooth mix of the data from the F extra rows of the matrix below the $k_y=0$ row with the F corresponding rows above, row ($k_y=+F$) with row ($k_y=-F$), row ($k_y=+F-1$) with row ($k_y=-F+1$), etc. The function used in the Margosian method attempts to balance the contributions of these rows by calculating coefficients $B_{k_y}$ (hereinafter shortened to $B_k$) that, when applied to corresponding rows, add to 1.0: $B_k=1.0-B_{-k}$ for k=1 to F. Because the central row ($k_y=0$) belongs to both the upper and lower matrix, its coefficient is 0.5. Thus, $B_k=1.0$ for $-N/2 \leq k_y \leq -F-1$ $B_k=1.0-B_{-k}$ for $-F \leq k_y \leq -1$ $B_k=0.5$ for $k_y=0$ $B_k=1.0-B_{-k}$ for $+1 \leq k_y \leq F$ $B_k=0$ for $F+1 \leq k_y \leq N2-1$      Eq. 1

Various functions can be used for the blending, but a "raised cosine" works well. For the Margosian method, this can be written:

$$B_k = 0.5\left[\sin\left(\frac{(-k_y\pi)}{2F+2}\right)+1\right]$$      Eq. 2 for $-F \leq k_y \leq +F$

Figure 3:
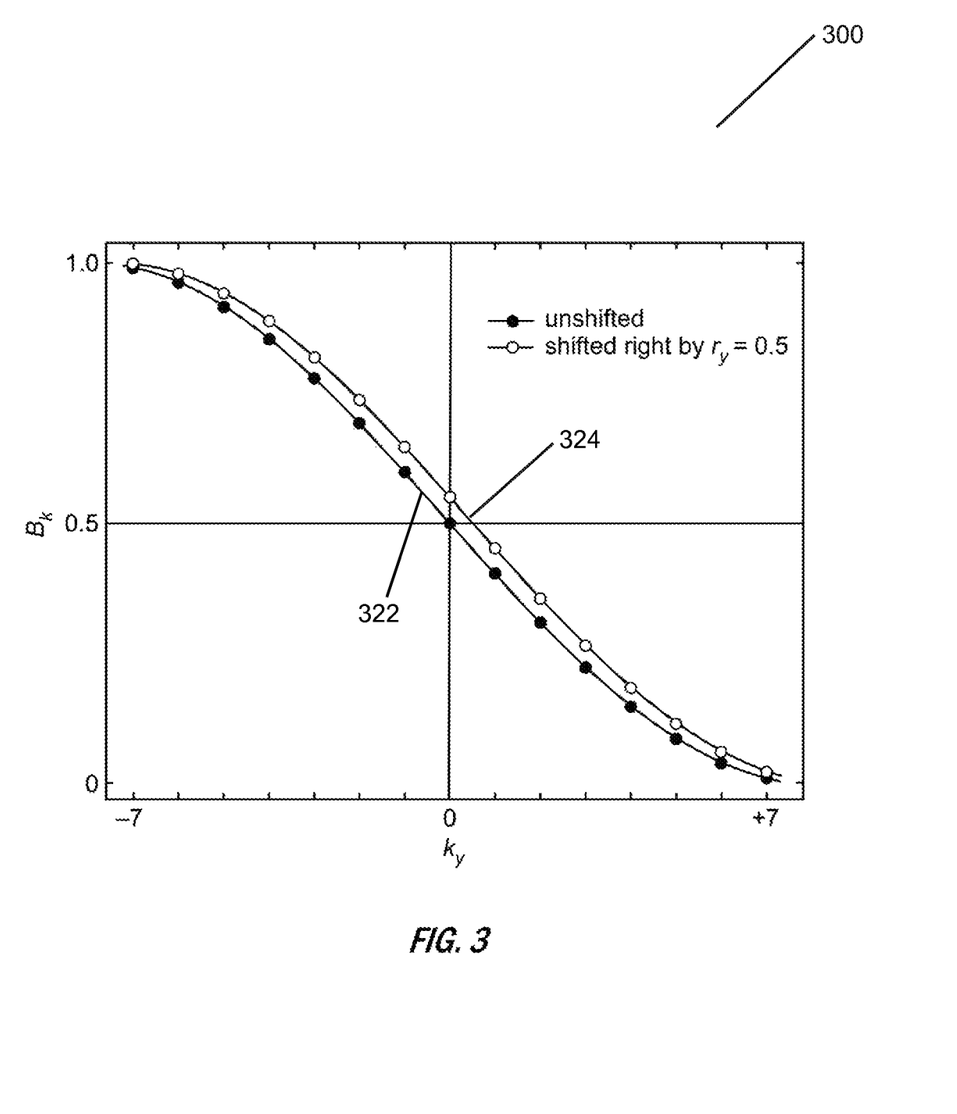
FIG. 3 shows a shift in the positive direction of an exemplary blending function, for use with embodiments disclosed herein.

FIG. 3 is a graph 300 which plots this function as 322 for an example with F=7. In step 5, each element of each row $k_y$ of the matrix is multiplied by the associated blending coefficient $B_k$. In step 6, the blended matrix is Fourier transformed in the row and column directions to produce a complex image. The image is phase corrected in step 7 by multiplying each pixel by the complex conjugate of the corresponding pixel of the phase map. The real part of the complex image may be extracted and displayed directly, or the absolute value of the real pixels may be computed to give the image an appearance compatible with ordinary magnitude MR images. While the Margosian method efficiently reconstructs images by using only two two-dimensional Fourier transforms, the images may show artifacts.

Sources of artifact in the Margosian method, however, include errors in the phase map, magnitude inconsistencies among the various raw data rows following application of the blending function, and rows damaged by missing data. The effects of phase map errors include the rotation of unwanted, blurred imaginary image components into the real part of the image. These effects are well known and lie outside the scope of the present invention.

It is observed that the blending function does not act as an overt high pass or low pass filter. Any choice of shape or width that satisfies Eq. 1 will, when applied to a hermitian raw matrix, give essentially the same reconstructed real image except for small changes in the noise level. The blending function serves to balance the real image contributions from various rows within the raw data matrix. Blending upper and lower row data serves to distribute, and so minimize, row amplitude errors. The value of blending upper and lower row data is well demonstrated by an example in which it is assumed that, because of a system maladjustment, the data are shifted upward by one row in the matrix, and the acquired data row containing the strong signal from the center of the echo appears not in the expected $k_y=0$ row, but rather in the $k_y=-1$ row. Further assume that the algorithms do not pre-shift the data to correct this. From the Fourier Shift Theorem, the reconstructed image will have a one-cycle phase roll (error) across the y dimension. For Method 2, the magnitude of row $k_y=-1$ is not adjusted, corresponding to a blending function value of one, and row $k_y=0$ is multiplied by 0.5. Thus, the true center of the echo is not halved as it should be, and the $k_y=0$ row is inappropriate. Because the central rows contribute strongly to the final image, these amplitude errors lead to significant image artifacts. The blending function used in the Margosian method seeks to ameliorate this by spreading the amplitude errors over additional raw data rows. For example, using a raised cosine (Eq. 2) with F=7, the central blending function values for $k_y=-1$, 0, and +1 are 0.5975, 0.5000, and 0.4025, respectively. If the center of the echo were placed in row $k_y=-1$, the magnitude error for this row using the Margosian method is only 19.5%, rather than the factor of two using Method 2. For this reason, the Margosian method is more successful than Method 2, particularly because the central rows sample the strongest MR signal. While the Margosian method pre-shifts the raw matrix by whole elements to avoid such a large misalignment of the matrix and the echo, the blending function also reduces the negative impact of partial misalignments, such as the center of the echo appearing between the sampled points of row $k_y=-1$ and those of row $k_y=0$.

The blending function of Eq. 2, however, may lead to artifacts if the matrix is not hermitian, which is typically the case. In particular, a partial misalignment of the echo in the y direction requires amplitude factors other than those calculated by Eq. 2, because the conditions in Eq. 1 no longer hold. The image components created by the raw data in rows −F to +F are no longer added together in the right proportions. The invention recognizes that a suitable function can be constructed by estimating the partial element shift, measured in row numbers, of the echo in the y direction, and then shifting the blending function by this amount. In FIG. 3, an exemplary blending function 322 is calculated with Eq. 2 and F=7 and shifted to the right by 0.5 row numbers to form 324. This realignment of the data with the blending function could also be accomplished by a partial element shift of the data sampling (vide supra), but this is usually accomplished by an analytical partial-cycle phase correction in the image domain, requiring additional processing time. Additionally, such analytical phase correction in the image domain is inferior to the more complete 2-D phase correction that can be obtained employing a phase map.

In a first embodiment of the invention, possible misalignment of the data rows and the blending function is addressed by shifting the blending function. In step 1, E additional rows of data are collected below the $k_y=0$ row. Rows below $k_y=+E$ are zeroed (217 in FIG. 2). In step 2, decimal values are computed for the row and column positions associated with the echo center. In other words, if the echo center is halfway between the $k_y=-1$ row and the $k_y=0$ row, the algorithm would return a decimal row value of −0.5. The concept of fractional row numbers is justified because the MR signal in continuous in the x direction for many common acquisition techniques, and the discrete steps in the y direction can be made arbitrarily fine. The fractional row numbers represent a resampling of an essentially continuous function. An example of an algorithm to determine the decimal row and column numbers locating the peak of the spin echo signal is a center of mass calculation performed on the magnitudes of the complex data points. Three or five columns of the matrix are used to determine $c_y$, the center in they direction, and 3 or 5 rows of the matrix are used to determine $c_x$, the center in the x direction. In both directions, the calculation is performed with raw data points positioned symmetrically about the assumed center of the matrix (initially $k_x=0$, $k_y=0$) to avoid bias. If the closest integers to $c_x$ and $c_y$ are nonzero, a new set of points symmetric about the revised center of the matrix ($s_x$ and $s_y$) may be used to refine the center of mass calculation. In they direction of the partial Fourier matrix, only 2E+1 points are symmetric around ($k_x=0$, $k_y=0$), and the center of mass of the magnitudes of the raw data elements utilizing three columns is:

$$c_y = \frac{\sum_{j=-1}^{j=+1} \sum_{i=-E}^{i=+E} i|A_{ij}|}{\sum_{j=-1}^{j=+1} \sum_{i=-E}^{i=+E} |A_{ij}|} \quad \text{Eq. 3}$$

In step 2, the nearest integer ("nint") values of $c_x$ and $c_y$ are computed to prepare for a shift of the matrix by whole positions.

$$s_x = \text{nint}(c_x) \quad s_y = \text{nint}(c_y) \quad \text{Eq. 4}$$

For positive values of $s_x$ each of the data elements in the raw matrix are cyclically shifted $s_x$ columns to the left in step 3. For negative values of $s_x$, the data are shifted to the right. For positive values of $s_y$, the data are shifted $s_y$ rows up; for negative values, they are shifted down (see FIG. 2). If, for example, $s_y=+1$, then the center of the echo is in row $k_y=+1$, and it is desired to move all the elements one position upward to place the echo into row $k_y=0$. If the data are moved upward or downward, the number of nonzero rows below the $k_y=0$ row is altered. In step 4, let F be the new number of nonzero rows below $k_y=0$ $$F = E - s_y \qquad \text{Eq. 5}$$

In step 5, the remaining partial row shift $r_y$ is computed.

$$r_y = C_y - S_y \qquad \text{Eq. 6}$$

For example, if the center of mass calculation determines that the center of the echo $c_y$ is in row +0.8, the integer row number $s_y$ is +1, and the matrix data will be shifted upward by one row. This places the center of the echo at row −0.2.

In step 6, a copy of the shifted raw matrix from step 3 is made. This copy is multiplied by a 2-dimensional digital low pass filter of ordinary design. The filter function is symmetric about the matrix center ($k_x=0$, $k_y=0$). This symmetry limits the full width of the function to 2F+1 points in the y direction. A somewhat longer filter length may be used in the x direction. The filter function is zero beyond this central region. In step 7, a 2-dimensional Fourier transform is applied to the filtered matrix from step 6 to yield a low resolution complex image. Each nonzero pixel is divided by its magnitude to give a normalized N×M complex matrix containing phase information, the "phase map." There is no need to extract explicit phase values in, for example, radians.

In step 8, a monotonic blending function is created to achieve a smooth mix of the data from the F extra rows of the matrix below the $k_y=0$ row with the F corresponding rows above, row ($k_y=+F$) with row ($k_y=-F$), row ($k_y=+F-1$) with row ($k_y=-F+1$), etc. The function used in the Margosian method assumes that the echo is centered at ($k_x=0$, $k_y=0$) and calculates coefficients $B_{k_y}$ (hereinafter shortened to $B_k$) that, when applied to corresponding rows, add to 1.0: $B_k=1.0-B_{-k}$ for k=1 to F. For a hermitian matrix, this maintains the proper intensity of each row, but these intensities will be incorrect if the echo is not centered on the $k_y=0$ row. The embodiment of the invention starts with a blending function obeying the criteria of Eq. 1, and then shifts the blending function by a fraction of a row $r_y$ (See FIG. 3). For example, the raised cosine function is modified to $$B_k = 0.5\left[\sin\left(\frac{-(k_y - r_y)\pi}{2F+2}\right) + 1\right] \qquad \text{Eq. 7}$$
$$\text{for } -F \le k_y \le +F$$

and a linear ramp is:

$$B_k = 0.5 - \frac{(k_y - r_y)}{2F+2} \qquad \text{Eq. 8}$$
$$\text{for } -F \le k_y \le +F$$

These functions have the appropriate value of $B_k=0.5$ at the true position of the echo. FIG. 3 shows the curve shift of an exemplary blending function computed from Eq. 7 with F=7 as $r_y$ is increased from 0 (322) to +0.5 (324).

In step 9, each element of each row $k_y$ of the shifted matrix from step 3 is multiplied by the corresponding blending coefficient $B_k$. In step 10, the matrix from step 9 is Fourier transformed in the row and column directions to produce a complex image. The image is phase corrected in step 11 by multiplying each pixel by the complex conjugate of the corresponding pixel of the phase map from step 7. In step 12, the real part of the complex image is extracted and displayed. Optionally, the absolute values of the real pixels may be computed to give the image an appearance compatible with ordinary magnitude MR images. This embodiment, compared to the Margosian method, provides a noticeable reduction in image artifacts for many images with a trivial increase in processing time.

A second source of artifact in the Margosian method is a limitation of the phase correction process when applied to a raw matrix having zeroed rows. It would be desirable to phase correct an acquired non-hermitian partial matrix to create a partial-Hermitian matrix. This could then be reconstructed by one of the three known methods to yield an artifact-free image. The difficulty of making this phase correction is best visualized in the raw domain, even though the actual phase correction is performed in the image domain. It has been described that a simple, one-cycle phase correction in the image y direction corresponds to a one-element shift in the raw matrix. Except for the shift, the data values are unaltered. However, a phase correction of a partial cycle in the y direction of the image causes a bleeding of information from one row of the raw matrix to the others, the effect being strongest between adjacent rows. In a full raw data matrix, this causes no distortion of the information. When rows are zeroed, however, a partial-cycle phase correction causes information from nonzero rows to bleed into the zeroed rows, and, importantly, information that should have been in the zeroed rows is not available to bleed into the occupied rows. The nonzero rows of the acquired non-hermitian partial matrix that are adjacent to, or near, zeroed rows are "damaged" during the phase correction process. The second embodiment seeks to create a nearly hermitian raw matrix by performing a map-based phase correction of the available data, and then deleting a small number, e.g. one to three, of the raw data rows that are adjacent to the original boundary between the acquired and the zeroed rows. This deletion cannot be performed by the blending function in the Margosian method, because this is applied before the raw data are transformed to the image domain, where the phase correction is performed. Rather, the original partial matrix is transformed to the image domain and phase corrected. Since the only remaining raw data operation is to multiply the rows by a modified blending function, processing time can be saved by using a forward column Fourier transform to convert the image data back to the half-transformed domain. The rows can be multiplied by constants without performing the row transforms back to the raw domain. The length of the blending function is reduced to cut off the desired number of damaged rows. The remaining processing proceeds as for the Margosian method.

In a second embodiment of the invention, possible misalignment of the data rows and the blending function is addressed by phase correcting in the image domain, thus aligning the data rows with the blending function in the raw domain. In step 1, E additional rows of data are collected below the $k_y=0$ row. Rows below $k_y=+E$ are zeroed (217 in FIG. 2). In step 2, nearest integer values are computed for the row and column positions associated with the echo center. While these positions may be found with a search for the data point with the maximum magnitude, a more robust procedure such as a center of mass algorithm can be used on the data point magnitudes. Three or five columns of the matrix are used to determine $c_y$, the center in the y direction, and 3 or 5 rows of the matrix are used to determine $c_x$, the center in the x direction. In both directions, the calculation is performed with raw data points positioned symmetrically about the assumed center of the matrix (initially $k_x=0$, $k_y=0$) to avoid bias. If the closest integers to $c_x$ and $c_y$ are nonzero, a new set of points symmetric about the revised center of the matrix ($s_x$ and $s_y$) may be used to refine the center of mass calculation. In they direction of the partial Fourier matrix, only 2E+1 points are symmetric around ($k_x$=0, $k_y$=0), and the center of mass of the magnitudes of the raw data elements utilizing three columns is:

duplicate $$c_y = \frac{\sum_{j=-1}^{j=+1}\sum_{i=-E}^{i=+E} i|A_{ij}|}{\sum_{j=-1}^{j=+1}\sum_{i=-E}^{i=+E} |A_{ij}|}$$ Eq. 3

In step 2, the nearest integer ("nint") values of $c_x$ and $c_y$ are computed to prepare for a shift of the matrix by whole positions.

$$s_x=\text{nint}(c_x) \quad s_y=\text{nint}(c_y)$$ Eq. 4 duplicate

For positive values of $s_x$, each of the data elements in the raw matrix are cyclically shifted $s_x$ columns to the left in step 3. For negative values of $s_x$, the data are shifted to the right. For positive values of $s_y$, the data are shifted $s_y$ rows up; for negative values, they are shifted down (see FIG. 2). If, for example, $s_y$=+1, then the center of the echo is in row $k_y$=+1, and it is desired to move all the elements one position upward to place the echo into row $k_y$=0. If the data are moved upward or downward, the number of nonzero rows below the $k_y$=0 row is altered. In step 4, let F be the new number of nonzero rows below $k_y$=0:

$$F=E-s_y$$ Eq. 5 duplicate

In step 5, a copy of the shifted raw matrix from step 3 is made. This copy is multiplied by a 2-dimensional digital low pass filter of ordinary design. The filter function is symmetric about the matrix center ($k_x$=0, $k_y$=0). This symmetry limits the full width of the function to 2F+1 points in they direction. A somewhat longer filter length may be used in the x direction. The filter function is zero beyond this central region. In step 6, a 2-dimensional Fourier transform is applied to the filtered matrix from step 5 to yield a low resolution complex image. Each nonzero pixel is divided by its magnitude to give a normalized N×M complex matrix containing phase information, the "phase map." There is no need to extract explicit phase values in, for example, radians.

In step 7, the matrix from step 3 is Fourier transformed in the row and column directions to produce a complex image. The image is phase corrected in step 8 by multiplying each pixel by the complex conjugate of the corresponding pixel of the phase map from step 6. In step 9, the forward column Fourier transform is applied to the image to obtain the half-transformed matrix. It is not necessary to return to the raw data domain.

In step 10, a reduced number of rows are selected to create the final image. Although rows −N/2 to F were acquired, only rows −N/2 to F−d will be used, where d is a small positive integer, typically 1-3, chosen to zero rows possibly damaged in the phase correction process. In step 11, a blending function is created to achieve a smooth mix of the data from the F−d extra rows of the matrix below the $k_y$=0 row with the F−d corresponding rows above, row ($k_y$=+F−d) with row ($k_y$=−F+d), row ($k_y$=+F−1−d) with row ($k_y$=−F+1+d), etc. The function used in this embodiment assumes that the echo is centered at ($k_x$=0, $k_y$=0) and calculates coefficients $B_k$ that, when applied to corresponding rows, add to 1.0: $B_k$=1.0−$B_{-k}$ for k=1 to F−d. For the nearly hermitian matrix expected after phase correction, this maintains the proper intensity of each row. This embodiment uses a blending function obeying the criteria of Eq. 1. For example, the raised cosine function is:

$$B_k = 0.5\left[\sin\left(\frac{-k_y\pi}{2F+2}\right)+1\right]$$ Eq. 9 for $-F+d \le k_y \le +F-d$ and a linear ramp is:

$$B_k = 0.5 - \frac{(k_y)}{2F+2}$$ Eq. 10 for $-F+d \le k_y \le +F-d$

Figure 4:
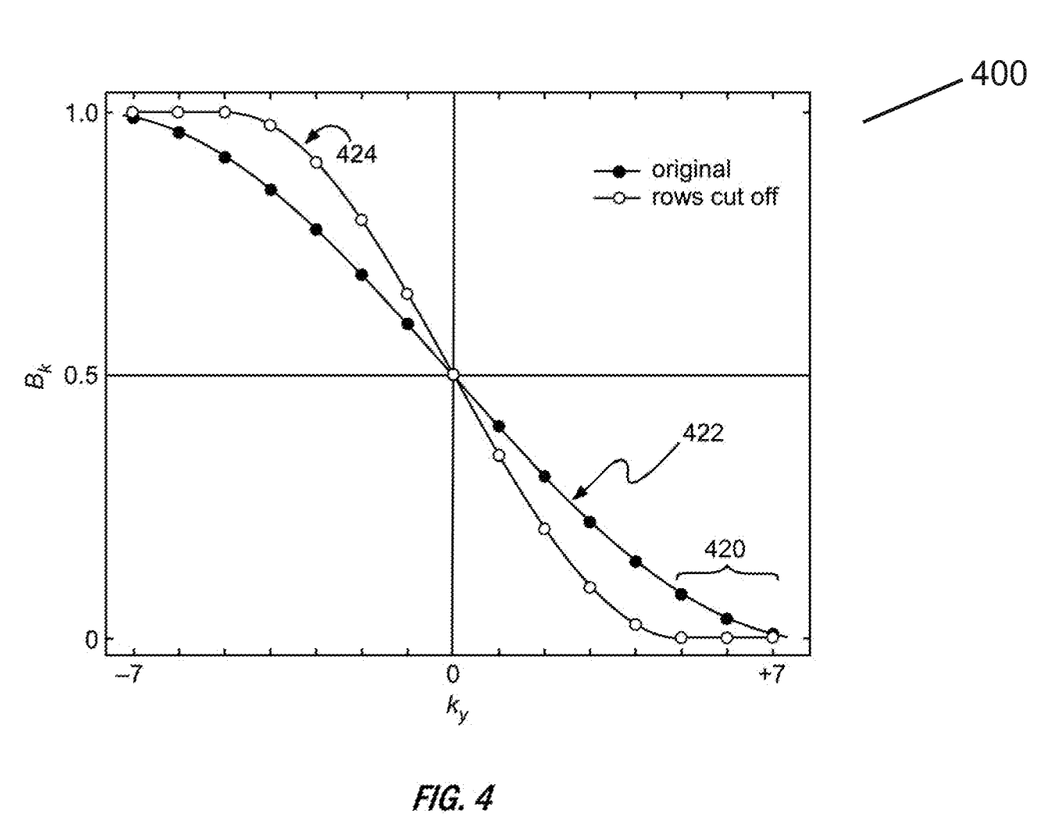
FIG. 4 shows the modification of an exemplary blending function deleting three rows of damaged data subsequent to phase correction according to embodiments disclosed herein.

These functions cut off the desired number of damaged rows d. FIG. 4 is a graph 400 illustrating the curve alteration of an exemplary blending function computed from Eq. 9 with F=7 as d is increased from 0 (422) to 3 (424), effectively cutting off any contribution from rows +5 to +7 (420).

In step 12, each element of each row $k_y$ of the half-transformed matrix from step 9 is multiplied by the corresponding blending coefficient $B_k$. In step 13, the matrix from step 12 is inverse Fourier transformed in the column direction to produce a complex image. The image is already phase corrected. In step 12, the real part of the complex image is extracted and displayed. Optionally, the absolute values of the real pixels may be computed to give the image an appearance compatible with ordinary magnitude MR images. This embodiment, compared to the Margosian method, provides a significant reduction in image artifacts for many images with a 50% increase in processing time, 6 1-D transforms versus 4. Compared to the first embodiment, the second embodiment is able to take full advantage of the 2-D phase map to correct for higher-order phase errors.

Figure 5:
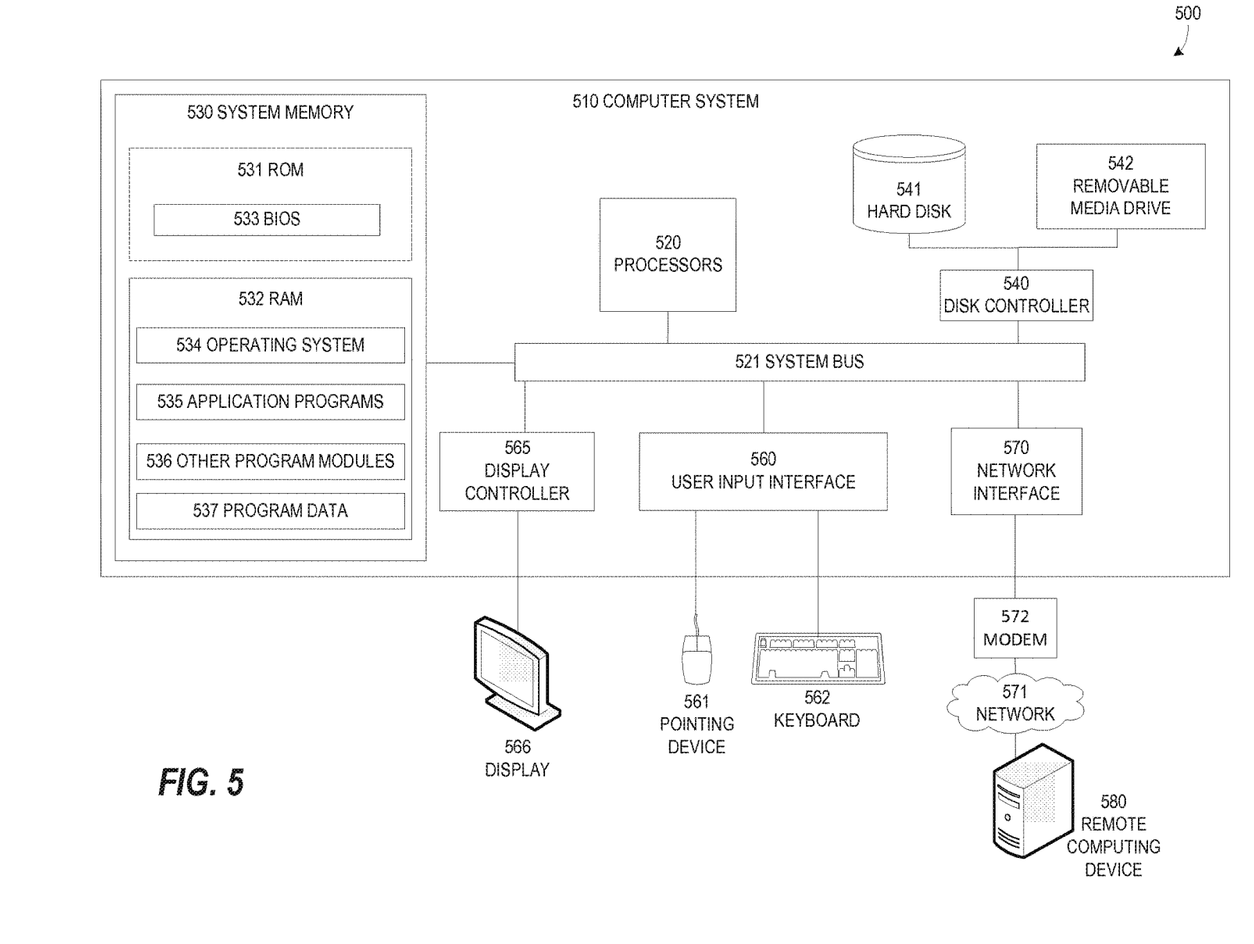
FIG. 5 illustrates an example of a computing environment within which embodiments of the invention may be implemented.
Figure 6:
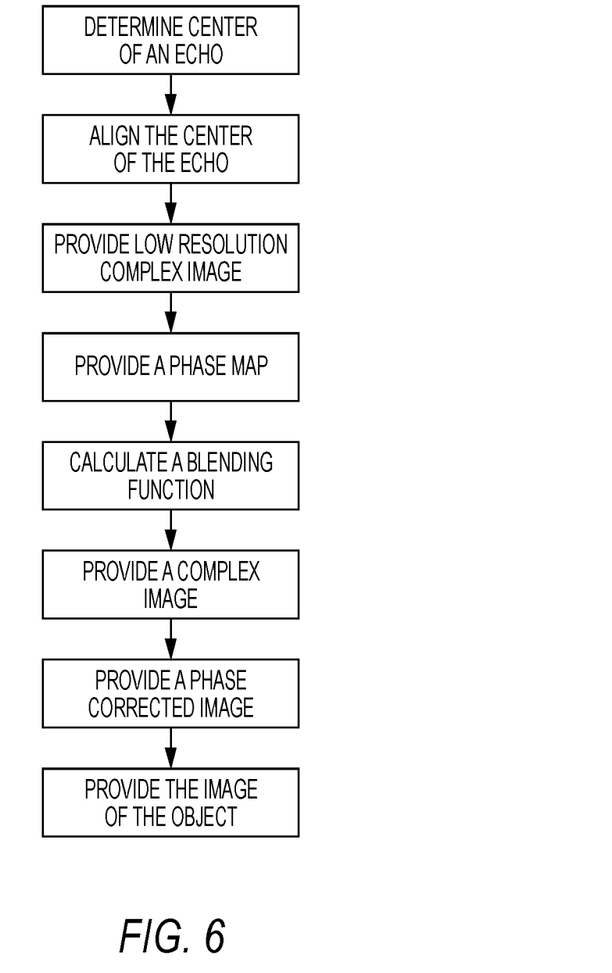
FIG. 6 is a diagram illustrating a method in accordance with exemplary embodiments of the present disclosure.
Figure 7:
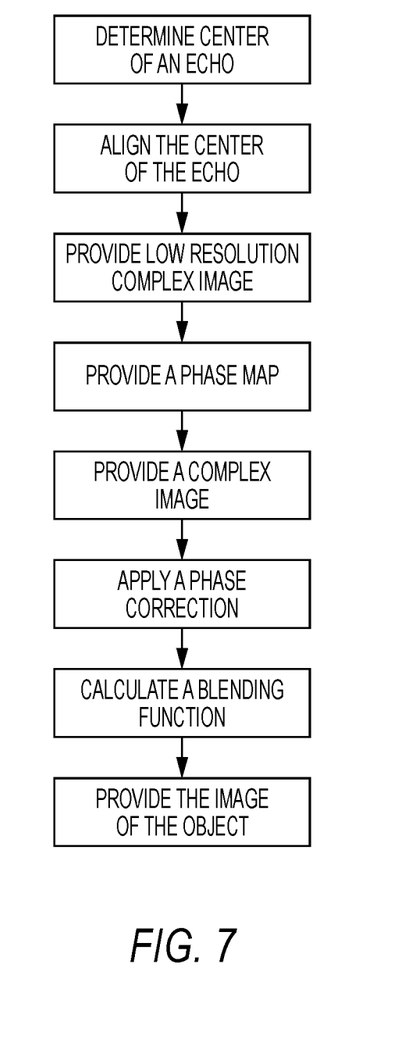
FIG. 7 is a diagram illustrating a method in accordance with exemplary embodiments of the present disclosure.

FIG. 5 illustrates an example of a computing environment 500 within which embodiments of the invention may be implemented. Computing environment 500 may include computer system 510, which is one example of a computing system upon which embodiments of the invention may be implemented. As shown in FIG. 5, the computer system 510 may include a communication mechanism such as a bus 521 or other communication mechanism for communicating information within the computer system 510. The computer system 510 further includes one or more processors 520 coupled with the bus 521 for processing the information. The processors 520 may include one or more CPUs, GPUs, or any other processor known in the art.

The computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system (BIOS) 533 containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a magnetic hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display or monitor 566, such as a cathode ray tube (CRT) or liquid crystal display (LCD), for displaying information to a computer user. The computer system includes a user input interface 560 and one or more input devices, such as a keyboard 562 and a pointing device 561, for interacting with a computer user and providing information to the processors 520. The pointing device 561, for example, may be a mouse, a trackball, or a pointing stick for communicating direction information and command selections to the processors 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more datastores and data files used by embodiments of the present invention. Datastore contents and data files may be encrypted to improve security. The processors 520 may also be employed in a multi-processing arrangement to execute the one or more sequences of instructions contained in system memory 530. In alternative embodiments, hardwired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any non-transitory, tangible medium that participates in providing instructions to the processors 520 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 510 operating in a networked environment using logical connections to one or more remote computers, such as remote computing device 580. Remote computing device 580 may be a personal computer (laptop or desktop), a mobile device, a server, a router, a network PC, a peer device or other common network node, and typically includes many or all of the elements described above relative to computer system 510. When used in a networking environment, computer system 510 may include modem 572 for establishing communications over a network 571, such as the Internet. Modem 572 may be connected to system bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computing system 580). The network 571 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The GUI also includes an executable procedure or executable application. The executable procedure or executable application conditions the display processor to generate signals representing the GUI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the GUI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of the figures presented herein are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. Further, the processes and applications may, in alternative embodiments, be located on one or more (e.g., distributed) processing devices on a network linking the units of FIG. 5. Any of the functions and steps provided in the Figures may be implemented in hardware, software or a combination of both. No claim element herein is to be construed under the provisions of 35 U.S.C. 112, sixth paragraph, unless the element is expressly recited using the phrase "means for."

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

Although the invention has been described with reference to exemplary embodiments, it is not limited thereto. Those skilled in the art will appreciate that numerous changes and modifications may be made to the preferred embodiments of the invention and that such changes and modifications may be made without departing from the true spirit of the invention. It is therefore intended that the appended claims be construed to cover all such equivalent variations as fall within the true spirit and scope of the invention.

The invention claimed is:

1. A method for producing an image of an object located in the field of view of a Magnetic Resonance (MR) imaging system, the image being reconstructed from a subset of data elements less than a raw matrix of data elements having N number of rows of data elements and M number of columns of data elements, the method comprising:

determining a center of an echo expressed as a whole column number, a fractional column number, a whole row number and a fractional row number of the raw matrix;

shifting the data elements of the raw matrix by whole positions to align the center of the echo, expressed as the whole column number and the whole row number, with the center of the raw matrix;

multiplying the shifted raw matrix by a low pass filter to provide a filtered matrix;

Fourier transforming the filtered matrix to provide a low resolution complex image and dividing each nonzero pixel of the low resolution complex image by its magnitude to provide a phase map;

calculating a blending function that compensates for the image artifacts created by fractional misalignment of the echo center with elements of the raw matrix, said blending function being shifted by the determined fractional echo position, and having blending coefficient values corresponding to each line of raw matrix data elements;

multiplying each data element of each row of the raw matrix by corresponding blending function coefficient values;

performing a two-dimensional Fourier transform in row directions and column directions to provide a complex image;

multiplying the complex image by a complex conjugate of the phase map to provide a phase corrected image; and extracting the real part of the complex numbers in the phase corrected image to provide the image of the object.

2. The method of claim 1, wherein the subset of data elements is data from a plurality of contiguous rows less than the N number of rows of data elements.

3. The method of claim 2, wherein the plurality of contiguous rows extend from a top row of the matrix and continue past a central row without extending to a bottom row of the matrix.

4. The method of claim 2, wherein the plurality of contiguous rows extend from a bottom row of the matrix and continue past a central row without extending to a top row of the matrix.

5. The method of claim 1, wherein the subset of data elements is data from a plurality of contiguous columns less than the M number of columns of data elements.

6. The method of claim 5, wherein the plurality of contiguous columns extend from a left end column of the matrix and continue past a central column without extending to a right end column of the matrix.

7. The method of claim 5, wherein the plurality of contiguous columns extend from a right end column of the matrix and continue past a central column without extending to a left end column of the matrix.

8. The method of claim 1, wherein the subset of data elements is data from three-dimensional slices.

9. The method of claim 1, wherein the subset of data elements is data from a dimension using Fourier transformation to provide the image of the object.

10. The method of claim 1, further comprising calculating the absolute values of the pixels of the image of the object to provide an absolute value image.

11. A method for producing an image of an object located in the field of view of a Magnetic Resonance (MR) imaging system, the image being reconstructed from a subset of data elements less than a raw matrix of data elements having N number of rows of data elements and M number of columns of data elements, the method comprising:

determining a center of an echo corresponding to a column of the raw matrix and a row of the raw matrix with a data element having the largest magnitude;

shifting the data elements of the raw matrix by whole positions to align the center of the echo with the center of the raw matrix;

multiplying the shifted raw matrix by a low pass filter to provide a filtered matrix;

Fourier transforming the filtered matrix to provide a low resolution complex image and divided each nonzero pixel of the low resolution complex image by its magnitude to provide a phase map;

Fourier transforming the shifted raw matrix to provide a complex image;

applying a phase correction to the complex image by multiplying each pixel by the complex conjugate of the corresponding pixel of the phase map;

Fourier transforming the columns of the image to obtain a half-transformed matrix;

calculating a blending function having blending function coefficient values for the data elements, said blending function cutting off rows of data damaged by the phase correction;

multiplying the rows of data elements of the half-transformed matrix by corresponding blending function coefficient values;

inverse Fourier transforming in a column direction and extracting real parts of the complex numbers to provide the image of the object.

12. The method of claim 11, wherein the subset of data elements is data from a plurality of contiguous rows less than the N number of rows of data elements.

13. The method of claim 11, wherein the subset of data elements is data from a plurality of contiguous columns less than the M number of columns of data elements.

14. The method of claim 11, wherein the subset of data elements is data from three-dimensional slices.

15. The method of claim 11, wherein the subset of data elements is data from a dimension using Fourier transformation to provide the image of the object.

16. The method of claim 11, further comprising taking the absolute values of the pixels of the image of the object to provide an absolute value image.

17. An article of manufacture for operating a Magnetic Resonance (MR) image reconstructing system, the article of manufacture comprising a non-transitory, tangible computer-readable medium holding computer-executable instructions for performing a method for producing an image of an object located in the field of view of a Magnetic Resonance (MR) imaging system, the image being reconstructed from a subset of data elements less than a raw matrix of data elements having N number of rows of data elements and M number of columns of data elements, the method comprising:

determining a center of an echo expressed as a whole column number, a fractional column number, a whole row number and a fractional row number of the raw matrix;

shifting the data elements of the raw matrix by whole positions to align the center of the echo, expressed as the whole column number and the whole row number, with the center of the raw matrix;

multiplying the shifted raw matrix by a low pass filter to provide a filtered matrix;

Fourier transforming the filtered matrix to provide a low resolution complex image and dividing each nonzero pixel of the low resolution complex image by its magnitude to provide a phase map;

calculating a blending function that compensates for the image artifacts created by fractional misalignment of the echo center with elements of the raw matrix, said blending function being shifted by the determined fractional echo position, and having blending coefficient values corresponding to each line of raw matrix data elements;

multiplying each data element of each row of the raw matrix by corresponding blending function coefficient values;

performing a two-dimensional Fourier transform in row directions and column directions to provide a complex image;

multiplying the complex image by a complex conjugate of the phase map to provide a phase corrected image; and extracting the real part of the complex numbers in the phase corrected image to provide the image of the object.

18. The article of manufacture of claim 17, wherein the subset of data elements is data from a plurality of contiguous rows less than the N number of rows of data elements.

19. The article of manufacture of claim 17, wherein the subset of data elements is data from a plurality of contiguous columns less than the M number of columns of data elements.

20. The article of manufacture of claim 17, wherein the subset of data elements is data from three-dimensional slices.

21. The article of manufacture of claim 17, wherein the subset of data elements is data from a dimension using Fourier transformation to provide the image of the object.

22. The article of manufacture of claim 17, further comprising calculating the absolute values of the pixels of the image of the object to provide an absolute value image.

* * * * *